(12) United States Patent
Tsunoda et al.

(10) Patent No.: US 12,477,694 B2
(45) Date of Patent: Nov. 18, 2025

(54) CIRCUIT DEVICE

(71) Applicant: Mitsubishi Electric Corporation, Tokyo (JP)

(72) Inventors: Yoshikazu Tsunoda, Tokyo (JP); Takashi Kumagai, Tokyo (JP); Tomohito Fukuda, Tokyo (JP); Yuji Shirakata, Tokyo (JP); Kenta Fujii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 163 days.

(21) Appl. No.: 18/559,574

(22) PCT Filed: Jun. 14, 2022

(86) PCT No.: PCT/JP2022/023769
§ 371 (c)(1),
(2) Date: Nov. 8, 2023

(87) PCT Pub. No.: WO2022/270352
PCT Pub. Date: Dec. 29, 2022

(65) Prior Publication Data
US 2024/0244796 A1 Jul. 18, 2024

(30) Foreign Application Priority Data
Jun. 22, 2021 (JP) .................... 2021-103422

(51) Int. Cl.
*H05K 7/20* (2006.01)
*H05K 1/18* (2006.01)
(52) U.S. Cl.
CPC ............. *H05K 7/2039* (2013.01); *H05K 1/18* (2013.01); *H05K 7/20336* (2013.01); *H05K 2201/10015* (2013.01)

(58) Field of Classification Search
CPC ........ H02M 7/003; H02M 1/00; H02M 3/003; H01G 2/08; H01G 2/10; H01G 2/02;
(Continued)

(56) References Cited

U.S. PATENT DOCUMENTS 11,330,742 B2* 5/2022 Yamashima ....... H05K 7/20445
2022/0264769 A1* 8/2022 Kishiwada ......... H05K 7/20509

FOREIGN PATENT DOCUMENTS

JP 2016066666 A 4/2016
JP 6961047 B1 10/2021

OTHER PUBLICATIONS

Matsuoka, Partition Member, JP2010132299 (Year: 2010).*
(Continued)

*Primary Examiner* — Michael A Matey
(74) *Attorney, Agent, or Firm* — Buchanan Ingersoll & Rooney PC

(57) ABSTRACT

A circuit device includes: a first heat sink having a first upper surface; a plurality of first partition plates and second partition plates attached to the first upper surface; a sealing material; a first circuit component; and a printed wiring board. A normal direction of the first upper surface is along a first direction. The first partition plates extend in a second direction orthogonal to the first direction. The second partition plates extend in a third direction orthogonal to the first direction and the second direction. The sealing material is made to fill a space defined by two adjacent first partition plates, two adjacent second partition plates, and the first upper surface. The first circuit component is disposed in the sealing material. The printed wiring board is disposed on the first partition plate and the second partition plate, and is electrically connected to the first circuit component.

13 Claims, 22 Drawing Sheets

(58) Field of Classification Search
CPC .......... H01G 4/38; H01G 11/10; H01G 11/18; H01G 11/78; H01G 11/82; H01G 2/106; H01G 9/0003; H01G 9/08; H01G 9/26; H05K 7/209; H05K 2201/066; H05K 5/0217; H05K 1/184; H05K 2203/1147; H05K 7/20409; H05K 7/20509; H05K 1/02; H05K 1/0203; H05K 1/0209; H05K 1/144; H05K 1/0306; H05K 1/181; H05K 2201/042; H05K 2203/1327; H05K 3/0061; H05K 3/284; H05K 5/0208; H05K 5/30; H05K 7/2039; H05K 7/20963; H05K 9/0037; H01L 23/367; H01L 2221/68345; H01L 2221/68359; H01L 2224/47; H01L 2224/48247; H01L 23/28; H01L 23/3121; H01L 23/36; H01L 23/3735; H01L 2924/181; B65D 5/6629

See application file for complete search history.

(56) References Cited

OTHER PUBLICATIONS

Inaba et al. Capacitor, JP H10116756 (Year: 1998).*
International Search Report (PCT/ISA/210) with translation and Written Opinion (PCT/ISA/237) mailed on Aug. 30, 2022, by the Japanese Patent Office as the International Searching Authority for International Application No. PCT/JP2022/023769. (8 pages).

* cited by examiner

CIRCUIT DEVICE

TECHNICAL FIELD

The present disclosure relates to a circuit device.

BACKGROUND ART

Japanese Patent Laying-Open No. 2016-66666 (PTL 1) describes a capacitor. The capacitor described in PTL 1 has a lid body, an electrode plate, a capacitor element, and a case. The lid body has a substrate and a fin. The fin is disposed on one surface of the substrate. The electrode plate is disposed on another surface of the substrate. The capacitor element is disposed on the electrode plate. The case is disposed on the lid body so as to cover the electrode plate and the capacitor element.

CITATION LIST

Patent Literature

PTL 1: Japanese Patent Laying-Open No. 2016-66666

SUMMARY OF INVENTION

Technical Problem

In the capacitor described in PTL 1, heat generated from the capacitor element is transferred to the electrode plate and the lid body on a lower surface (the surface in contact with the electrode plate) of the capacitor element. However, another surface of the capacitor element does not contribute to heat dissipation. That is, the capacitor described in PTL 1 has room for improvement in heat dissipation performance.

The present disclosure has been made in view of the above-described problem of the related art. More specifically, the present disclosure provides a circuit device with improved heat dissipation performance for circuit components.

Solution to Problem

A circuit device of the present disclosure includes a first heat sink having a first upper surface, a plurality of first partition plates and second partition plates attached to the first upper surface, a sealing material, a first circuit component, and a printed wiring board. A normal direction of the first upper surface is along a first direction. The first partition plates extend in a second direction orthogonal to the first direction. The second partition plates extend in a third direction orthogonal to the first direction and the second direction. The sealing material is made to fill a space defined by two adjacent first partition plates, two adjacent second partition plates, and the first upper surface. The first circuit component is disposed inside the sealing material, and thermally and mechanically bonded. The printed wiring board is disposed on the first partition plate and the second partition plate, and is electrically connected to the first circuit component.

Advantageous Effects of Invention

According to the circuit device of the present disclosure, heat dissipation performance for circuit components can be improved.

DESCRIPTION OF EMBODIMENTS

Figure 1:
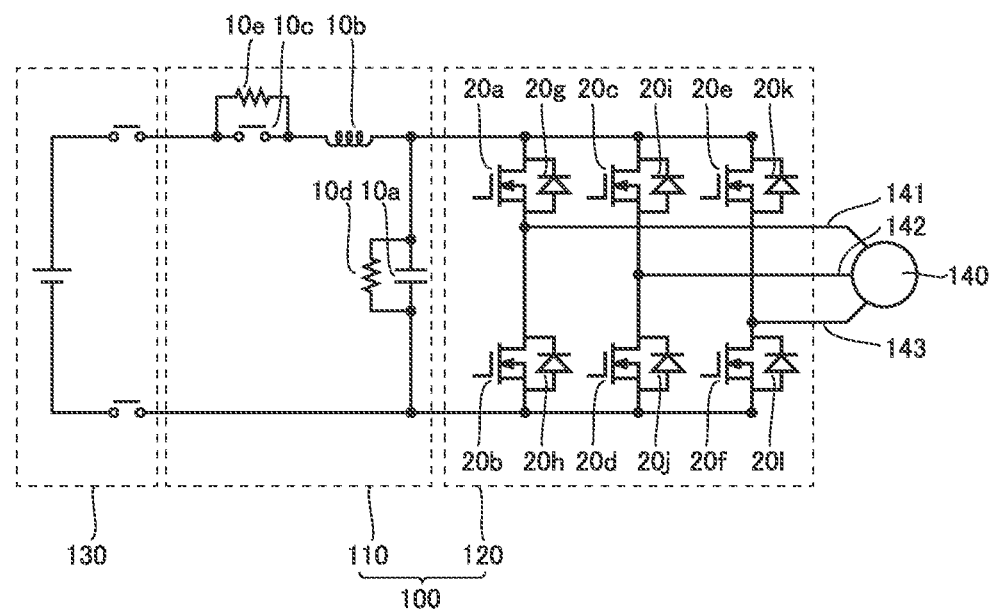
FIG. 1 is a circuit diagram of a circuit device 100.

Details of embodiments of the present disclosure will be described with reference to the drawings. In the following drawings, the same or corresponding parts are denoted by the same reference numerals, and redundant descriptions will not be repeated.

First Embodiment

A circuit device (hereinafter referred to as "circuit device 100") according to a first embodiment will be described.
(Configuration of Circuit Device 100)
Circuit device 100 is, for example, a power conversion device. Although circuit device 100 is not limited to the power conversion device, the power conversion device will be described below as an example of circuit device 100. FIG. 1 is a circuit diagram of circuit device 100. As illustrated in FIG. 1, circuit device 100 has a peripheral circuit 110 and a switching circuit 120.

Peripheral circuit 110 has a plurality of first circuit components 10. In the example illustrated in FIG. 1, the plurality of first circuit components 10 are a capacitor 10a, an inductor 10b, a contactor 10c, a discharge resistor 10d, and a charge resistor 10e. Capacitor 10a, inductor 10b, and contactor 10c are connected in series. Inductor 10b is disposed between capacitor 10a and contactor 10c. Discharge resistor 10d and charge resistor 10e are connected in parallel to capacitor 10a and contactor 10c, respectively. Peripheral circuit 110 is connected to a DC supply circuit 130.

Switching circuit 120 is, for example, a three-phase inverter circuit. Switching circuit 120 has a plurality of second circuit components 20. In the example illustrated in FIG. 1, the plurality of second circuit components 20 are transistors 20a to 20f and diodes 20g to 20l.

A drain of transistor 20a is electrically connected to one electrode of capacitor 10a. A source of transistor 20a is electrically connected to a drain of transistor 20b. A source of transistor 20b is electrically connected to another electrode of capacitor 10a.

An anode of diode 20g is electrically connected to the source of transistor 20a. A cathode of diode 20g is electrically connected to the drain of transistor 20a. An anode of diode 20h is electrically connected to the source of transistor 20b. A cathode of diode 20h is electrically connected to the drain of transistor 20b.

Note that transistor 20c, transistor 20d, diode 20i, and diode 20j are connected similarly to transistor 20a, transistor 20b, diode 20g, and diode 20h, respectively. Further, transistor 20e, transistor 20f, diode 20k, and diode 20l are connected similarly to transistor 20a, transistor 20b, diode 20g, and diode 20h, respectively. Although not illustrated, gates of transistors 20a to 20f are connected to a control circuit.

Switching circuit 120 is connected to a motor 140. Motor 140 is, for example, a three-phase motor. Motor 140 has an input line 141, an input line 142, and an input line 143. Input line 141 is electrically connected to the source of transistor 20a and the drain of transistor 20b. Input line 142 is electrically connected to the source of transistor 20c and the drain of transistor 20d. Input line 143 is electrically connected to the source of transistor 20e and the drain of transistor 20f.

Figure 2:
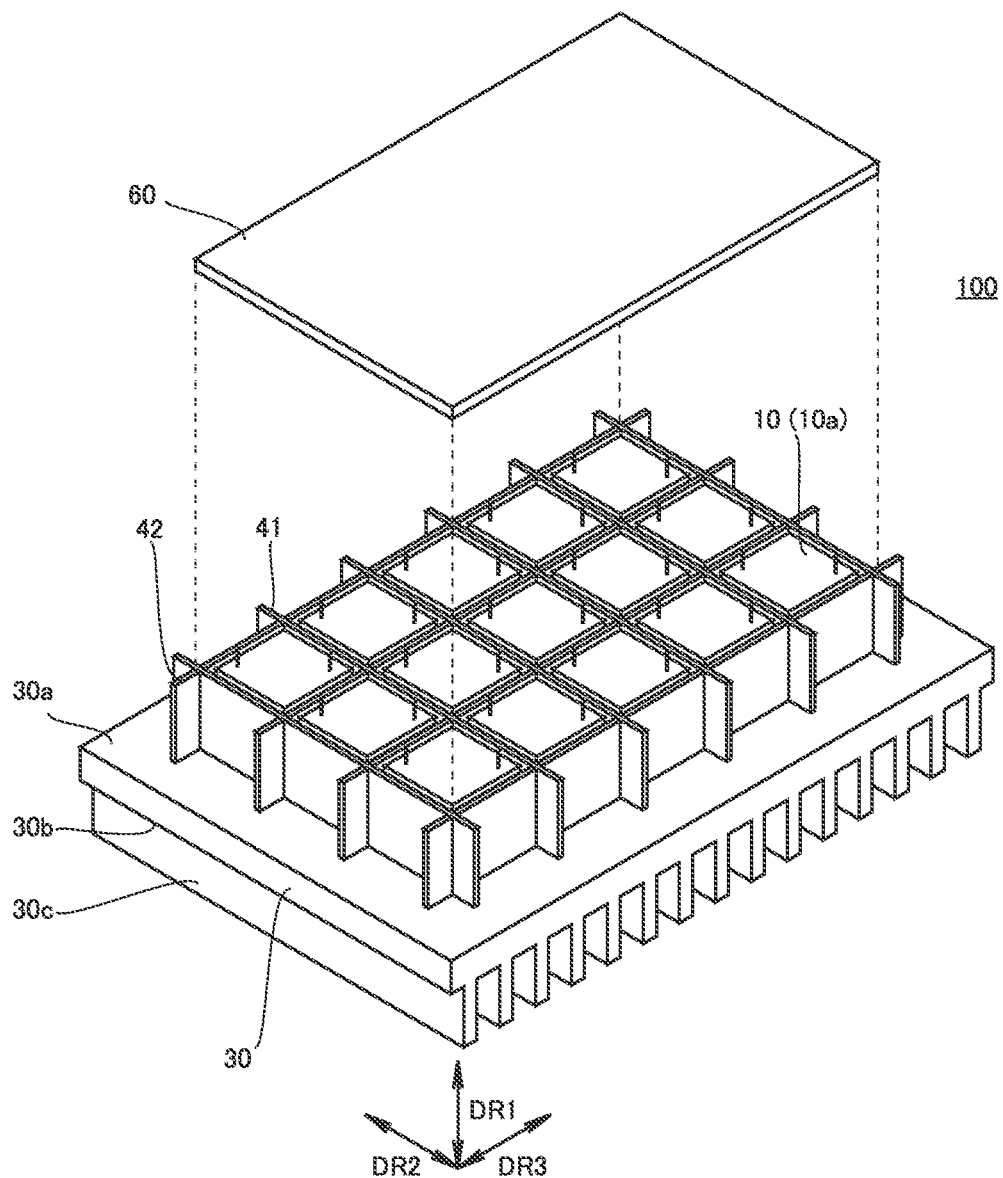
FIG. 2 is an exploded perspective view of circuit device 100.

FIG. 2 is an exploded perspective view of circuit device 100. As illustrated in FIG. 2, circuit device 100 further has a first heat sink 30, a plurality of first partition plates 41, and a plurality of second partition plates 42.

First heat sink 30 has an upper surface 30a and a lower surface 30b. Lower surface 30b is a surface opposite to upper surface 30a. Hereinafter, a direction along a normal line of upper surface 30a is referred to as a first direction DR1. Further, in the following description, a direction orthogonal to first direction DR1 is referred to as a second direction DR2, and a direction orthogonal to first direction DR1 and second direction DR2 is referred to as a third direction DR3.

A plurality of fins 30c are formed on lower surface 30b. Fins 30c extend, for example, in second direction DR2. The plurality of fins 30c are disposed at intervals in third direction DR3. First heat sink 30 is formed by, for example, a metal material having an excellent thermal conductivity, such as copper (copper alloy) or aluminum (aluminum alloy). First heat sink 30 is formed by extrusion processing, for example. The extrusion processing is performed, for example, along an extending direction (second direction DR2) of fin 30c.

First partition plate 41 is attached to upper surface 30a. First partition plate 41 extends in second direction DR2. The plurality of first partition plates 41 are disposed at intervals in third direction DR3. For first partition plate 41, for example, a rolled material formed by a metal material having an excellent thermal conductivity such as copper (copper alloy) or aluminum (aluminum alloy) is used.

Second partition plate 42 is attached to upper surface 30a. Second partition plate 42 extends in third direction DR3. The plurality of second partition plates 42 are disposed at intervals in second direction DR2. From another point of view of this fact, first partition plate 41 and second partition plate 42 are attached to upper surface 30a in a parallel-cross pattern. For second partition plate 42, for example, a rolled material formed by a metal material having an excellent thermal conductivity such as copper (copper alloy) or aluminum (aluminum alloy) is used.

Figure 3:
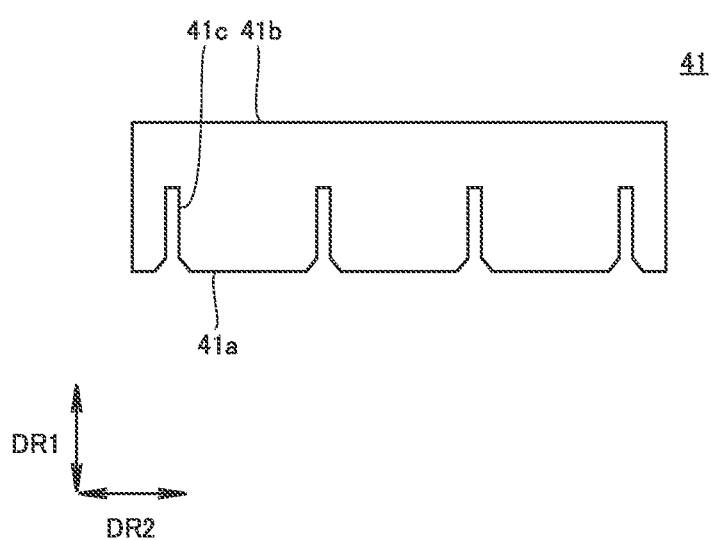
FIG. 3 is a plan view of a first partition plate 41 included in circuit device 100.

FIG. 3 is a plan view of first partition plate 41 included in circuit device 100. As illustrated in FIG. 3, first partition plate 41 has a first end 41a and a second end 41b. First end 41a is an end on upper surface 30a side. Second end 41b is an end on a side opposite to first end 41a. A plurality of first insertion ports 41c are formed in first partition plate 41. First insertion ports 41c extend from first end 41a toward second end 41b side. The plurality of first insertion ports 41c are disposed at intervals in second direction DR2. First insertion ports 41c penetrate first partition plate 41 along a thickness direction.

Figure 4:
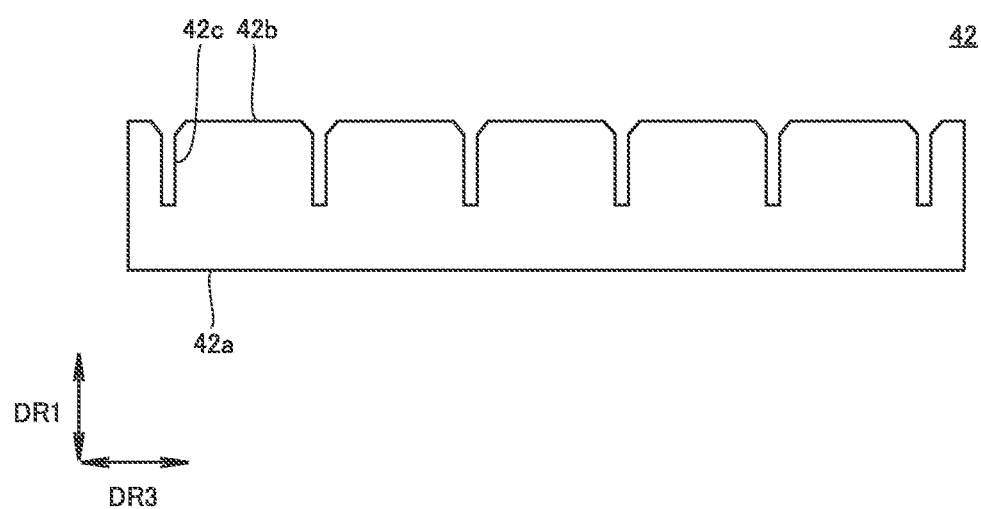
FIG. 4 is a plan view of a second partition plate 42 included in circuit device 100.

FIG. 4 is a plan view of second partition plate 42 included in circuit device 100. As illustrated in FIG. 4, second partition plate 42 has a third end 42a and a fourth end 42b. Third end 42a is an end on upper surface 30a side. Fourth end 42b is an end on a side opposite to third end 42a. A plurality of second insertion ports 42c are formed in second partition plate 42. Second insertion ports 42c extend from fourth end 42b toward third end 42a side. The plurality of second insertion ports 42c are disposed at intervals in third direction DR3. Second insertion ports 42c penetrate second partition plate 42 along a thickness direction.

Figure 6:
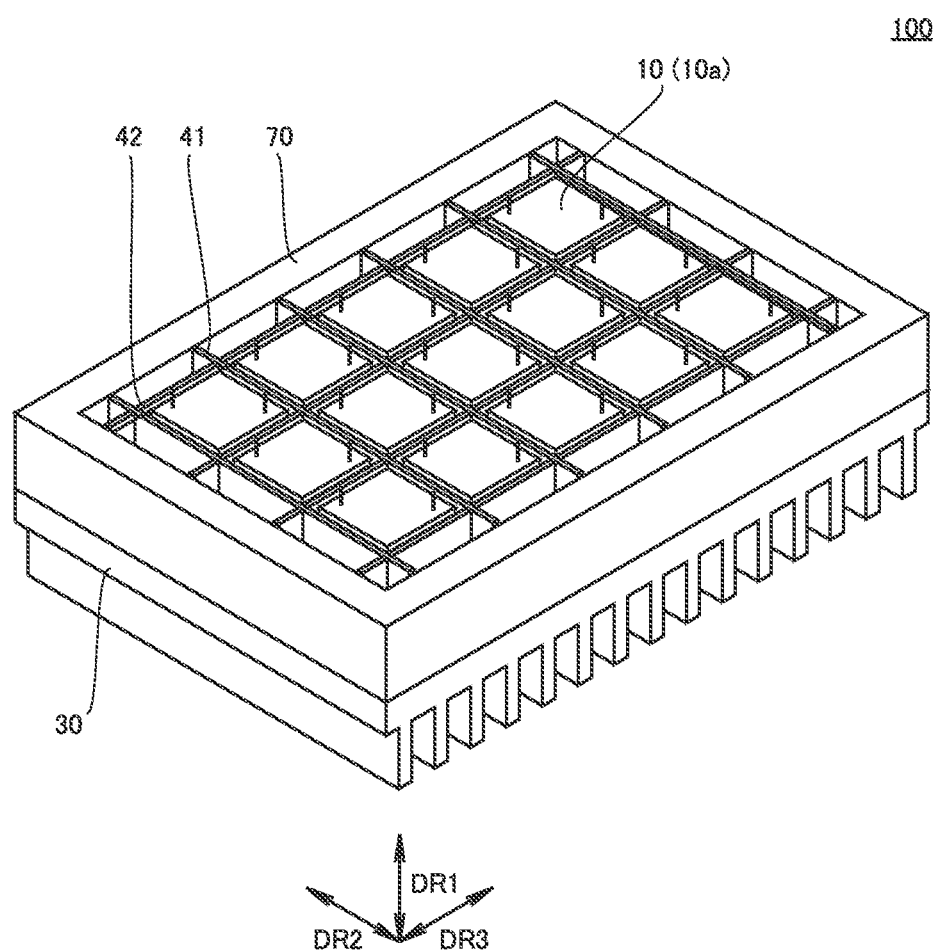
FIG. 6 is a perspective view of a circuit device 100 according to a modification.

First insertion port 41c is inserted into second insertion port 42c. This prevents first partition plate 41 and second partition plate 42 from interfering with each other. In FIG. 6, while first partition plate 41 and second partition plate 42 cross each other as described above, first partition plate 41 and second partition plate 42 constituting an outer periphery may be fixed to each other by, for example, fitting, swaging, welding, or the like so as to fill a gap around each insertion port after assembly. For example, in a case where each gap described above is small enough to prevent liquid leakage, first partition plate 41 and second partition plate 42 may not be completely fixed to each other.

Figure 5:
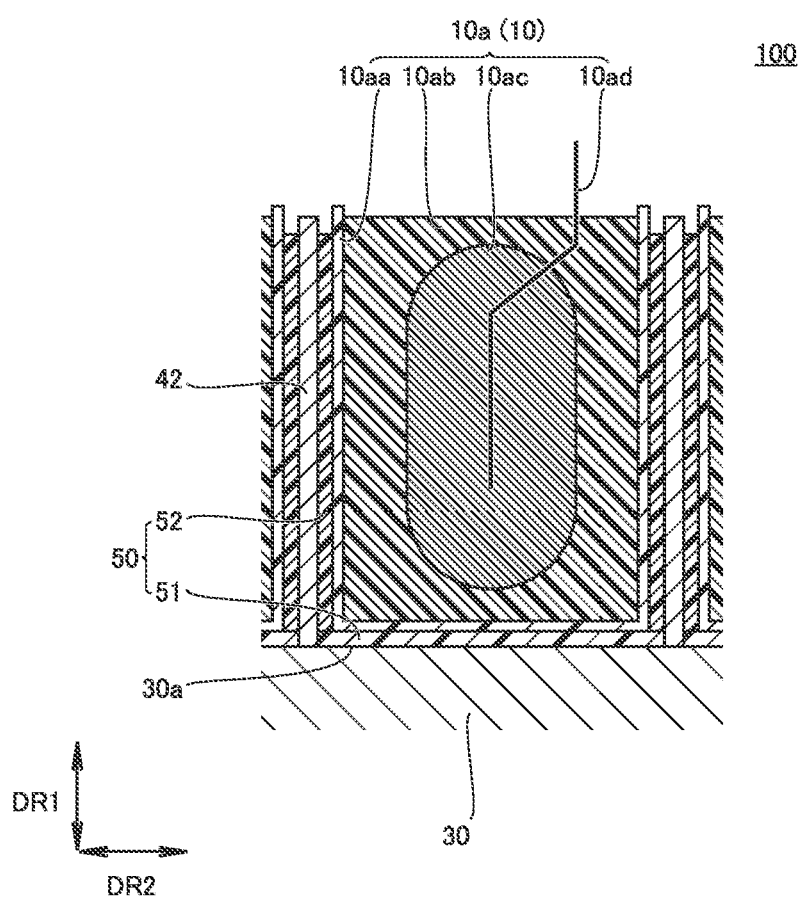
FIG. 5 is a cross-sectional view of circuit device 100.

FIG. 5 is a cross-sectional view of circuit device 100. As illustrated in FIG. 5, circuit device 100 further has a sealing material 50. Sealing material 50 is made to fill a space defined by two first partition plates 41 adjacent in third direction DR3, and two second partition plates 42 adjacent in second direction DR2, and upper surface 30a.

First circuit component 10 (capacitor 10a) is disposed in sealing material 50. Capacitor 10a has an exterior case 10aa, a sealing resin 10ab, a capacitor element body 10ac, and a lead wire 10ad. Exterior case 10aa is filled with sealing resin 10ab. In sealing resin 10ab, capacitor element body 10ac is disposed. Capacitor element body 10ac is formed by winding a dielectric film on which a metal foil is laminated. Lead wire 10ad is electrically connected to capacitor element body 10ac. A part of lead wire 10ad is located outside exterior case 10aa.

Sealing material 50 has, for example, a heat dissipation auxiliary material 51 and a molding material 52. Heat dissipation auxiliary material 51 is applied onto upper surface 30a. Heat dissipation auxiliary material 51 is in contact with first circuit component 10 (capacitor 10a). More specifically, heat dissipation auxiliary material 51 is in contact with a top surface of exterior case 10aa. Molding material 52 is disposed on heat dissipation auxiliary material 51. Molding material 52 is in contact with first circuit component 10 (a side surface of exterior case 10aa), first partition plate 41, and second partition plate 42.

Heat dissipation auxiliary material 51 is made by an adhesive, grease, gel, or insulating sheet containing a resin material such as silicone resin, epoxy resin, or urethane resin. Heat dissipation auxiliary material 51 may be mixed with a thermally conductive filler such as ceramics or metal, in order to improve a thermal conductivity. Heat dissipation auxiliary material 51 may be, for example, a material having a thermal conductivity of 1 W/m·K to several tens of W/m·K. Molding material 52 is made by a resin material having a high thermal conductivity. Molding material 52 may be made by, for example, epoxy resin, silicone resin, urethane resin, polyphenylene sulfide (PPS) resin, polyether ether ketone (PEEK) resin or an acrylonitrile-butadiene-styrene (ABS) resin, containing a thermally conductive filler. A Young's modulus of molding material 52 may be greater than or equal to 1 MPa and less than or equal to 50 GPa. A thermal conductivity of molding material 52 may be greater than or equal to 0.1 W/m·K and less than or equal to 20 W/m·K. By sealing molding material 52, vibration resistance and environmental resistance are improved. Heat dissipation auxiliary material 51 and molding material 52 may be made by the same material. For example, heat dissipation auxiliary material 51 and molding material 52 may be adhesives.

As illustrated in FIG. 2, circuit device 100 further has a printed wiring board 60. Printed wiring board 60 is disposed on first partition plate 41 and second partition plate 42. Further, printed wiring board 60 is electrically connected to a plurality of first circuit components 10. More specifically, a terminal (lead wire 10ad, in a case where first circuit component 10 is capacitor 10a) of first circuit component 10 is inserted into printed wiring board 60. As a result, wiring of peripheral circuit 110 illustrated in FIG. 1 is realized.

In assembly of circuit device 100, first, first partition plate 41 and second partition plate 42 are attached to upper surface 30a. More specifically, in a state where second partition plate 42 is arranged on upper surface 30a, first partition plate 41 is fitted into second partition plate 42. Secondly, heat dissipation auxiliary material 51 is applied onto upper surface 30a. Thirdly, first circuit component 10 is disposed in a space defined by two adjacent first partition plates 41, two adjacent second partition plates 42, and upper surface 30a. Fourthly, molding material 52 is injected into the space described above. Fifthly, after molding material 52 is cured, first circuit component 10 and printed wiring board 60 are connected. This connection is performed, for example, by soldering.

(Effects of Circuit Device 100)

In circuit device 100, a top surface of first circuit component 10 is in contact with first heat sink 30 with sealing material 50 (heat dissipation auxiliary material 51) interposed therebetween. Further, in circuit device 100, a side surface of first circuit component 10 is in contact with first partition plate 41 and second partition plate 42 with sealing material 50 (molding material 52) interposed therebetween. Therefore, heat is dissipated from the side surface and the top surface of first circuit component 10, and heat dissipation performance is improved.

As a result of improving the heat dissipation performance of first circuit component 10, the service life of first circuit component 10 is improved. For example, in a case where first circuit component 10 is capacitor 10a, the service life becomes about twice when a temperature is reduced by 10° C. In addition, in a case where first circuit component 10 is inductor 10b, the service life of the enamel coating of inductor 10b is about twice when a temperature is reduced by 10° C. Furthermore, in a case where first circuit component 10 is discharge resistor 10d and charge resistor 10e, when a temperature is reduced, ranks of electric power categories of discharge resistor 10d and charge resistor 10e can be reduced according to temperature derating. As a result, the number of series or parallel discharge resistors 10d and charge resistors 10e can be reduced.

In circuit device 100, thermal diffusion (thermal radiation) between first circuit components 10 adjacent to each other with first partition plate 41 (second partition plate 42) interposed therebetween can be suppressed. Therefore, first circuit component 10 can be electrically optimally disposed without being thermally restricted. For example, as a result that capacitor 10a and discharge resistor 10d can be disposed close to each other, discharge wiring of capacitor 10a is disconnected at some midpoint, and occurrence of an electric shock due to a residual charge can be suppressed. In circuit device 100, a plurality of first partition plates 41 and a plurality of second partition plates 42 having a high thermal conductivity are disposed. Therefore, temperatures of first circuit components 10 having different temperatures during a normal operation are equalized. When the plurality of disposed first circuit components 10 are identical components, first circuit component 10 disposed near a center of circuit device 100 receives heat from first circuit component 10 disposed around thereof, and a temperature rise increases. On the other hand, a temperature rise of first circuit component 10 disposed on an outer peripheral portion of circuit device 100 is small because there are few first circuit components 10 around thereof. In this way, an amount of the temperature rise of first circuit component 10 varies depending on the disposed position, and a temperature difference occurs between first circuit components 10 disposed at different positions. In circuit device 100, since heat of entire circuit device 100 can be equalized by disposing the plurality of first partition plates 41 and the plurality of second partition plates 42 having a high thermal conductivity, a temperature difference of the plurality of disposed first circuit components 10 can be reduced. Since the temperature derating is determined by first circuit component 10 having the largest temperature rise, circuit device 100 can be effectively used when the temperature difference of the plurality of disposed first circuit components 10 is small.

In circuit device 100, first partition plate 41 and second partition plate 42 function as electromagnetic shields. For example, in a case where first circuit component 10 is inductor 10b, a leakage magnetic flux from inductor 10b is shielded by first partition plate 41 and second partition plate 42, so that it is possible to improve accuracy of sensor components (such as a current sensor using a Hall element) disposed closely.

In circuit device 100, first partition plate 41 and second partition plate 42 function as fire walls. For example, in a case where one of first circuit components 10 is capacitor 10a, when a spark of discharge is generated due to a failure of capacitor 10a, the spark is blocked by first partition plate 41 and second partition plate 42, and an impact on other first circuit components 10 is prevented.

In circuit device 100, sealing material 50 (molding material 52) is made to fill a space defined by two adjacent first partition plates 41, two adjacent second partition plates 42, and upper surface 30a, so that vibration resistance characteristics of first circuit component 10 can be improved.

Circuit device 100 is a structure made by a combination of first partition plate 41, second partition plate 42, and first heat sink 30. Therefore, it is possible to increase or decrease the number of cells in the parallel-cross pattern constituted by first partition plate 41 and second partition plate 42, in accordance with the number or size of first circuit component 10. Further, in circuit device 100, thicknesses, types, plate thicknesses, and the like of first partition plate 41 and second partition plate 42 can be freely selected. In addition, in circuit device 100, bending processing and uneven press processing are performed on first partition plate 41 and second partition plate 42, so that strength of first partition plate 41 and second partition plate 42 can be secured and a shape of cells in the parallel-cross pattern can be changed. As a result, in circuit device 100, various specifications can be implemented flexibly and at low cost.

In circuit device 100, first circuit component 10 is disposed in a space defined by two adjacent first partition plates 41, two adjacent second partition plates 42, and upper surface 30a, so that first circuit component 10 can be easily inserted, and a terminal position of first circuit component 10 can be positioned simultaneously with the insertion. Then, in circuit device 100, because first circuit component 10 is connected by inserting the terminal of first circuit component 10 into printed wiring board 60, printed wiring board 60 is easily assembled. Note that, since first circuit components 10 are connected to each other by using printed wiring board 60, first circuit components 10 can be freely electrically connected to each other.

Connection (soldering) between the terminal of first circuit component 10 and printed wiring board 60 can be performed using a flow soldering tank or a point soldering device. That is, since the terminal of first circuit component 10 can be connected to printed wiring board 60 by using existing equipment, capital investment can be suppressed.

Modification

FIG. 6 is a perspective view of circuit device 100 according to a modification. As illustrated in FIG. 6, circuit device 100 may further have a case 70. Case 70 is disposed on upper surface 30a so as to be positioned outside first partition plate 41 and second partition plate 42. For example, in a case where case 70 is fitted to upper surface 30a and fixed by swaging, welding, or the like, even if first partition plate 41 and second partition plate 42 are not fixed to first heat sink 30, sealing material 50 can be made to fill a space defined by first partition plate 41, second partition plate 42, and first heat sink 30.

Any of capacitor 10a, inductor 10b, contactor 10c, discharge resistor 10d, and charge resistor 10e may be disposed as first circuit component 10 used in circuit device 100. Further, without limiting to this, any component that generates heat can be used as first circuit component 10 for circuit device 100.

Further, in circuit device 100, only one first circuit component 10 may be disposed in one section, or a plurality of first circuit components 10 may be disposed in one section. In a case where one first circuit component 10 is disposed in one section, all the cooling capabilities of the one section can be used for the one first circuit component 10. In a case where a plurality of first circuit components 10 are disposed in one section, the cooling capacity is divided, but first circuit component 10 can be more efficiently disposed if first circuit component 10 is small and the section is large.

Furthermore, in circuit device 100, there may be a section (disposition section) in which first circuit component 10 is disposed and a section (non-disposition section) in which first circuit component 10 is not disposed. In this case, the cooling effect of first circuit component 10 disposed in the disposition section adjacent to the non-disposition section can be further enhanced, and first circuit component 10 can be cooled more effectively.

Second Embodiment

A circuit device (hereinafter referred to as "circuit device 100A") according to a second embodiment will be described. Here, differences from circuit device 100 will be mainly described, and redundant descriptions will not be repeated.

(Configuration of Circuit Device 100A)

Figure 7:
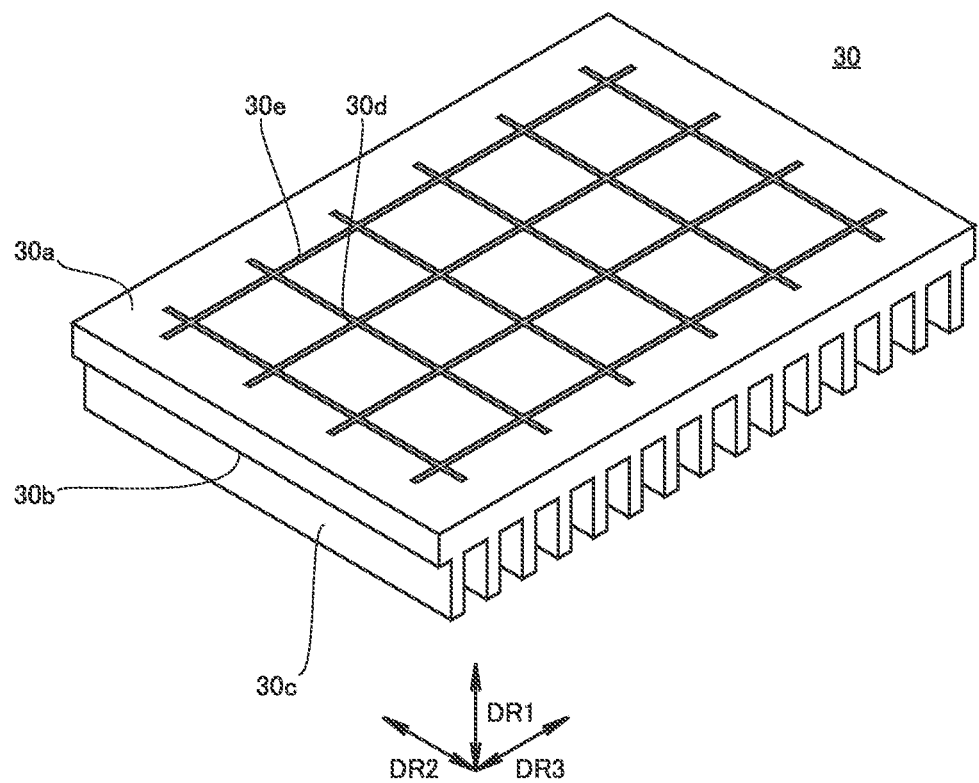
FIG. 7 is a perspective view of a first heat sink 30 included in circuit device 100A.

FIG. 7 is a perspective view of a first heat sink 30 included in circuit device 100A. As illustrated in FIG. 7, in circuit device 100A, a plurality of first grooves 30d and a plurality of second grooves 30e are formed on an upper surface 30a. First grooves 30d extend in a second direction DR2. The plurality of first grooves 30d are disposed at intervals in a third direction DR3. Second grooves 30e extend in third direction DR3. The plurality of second grooves 30e are disposed at intervals in second direction DR2.

Figure 8:
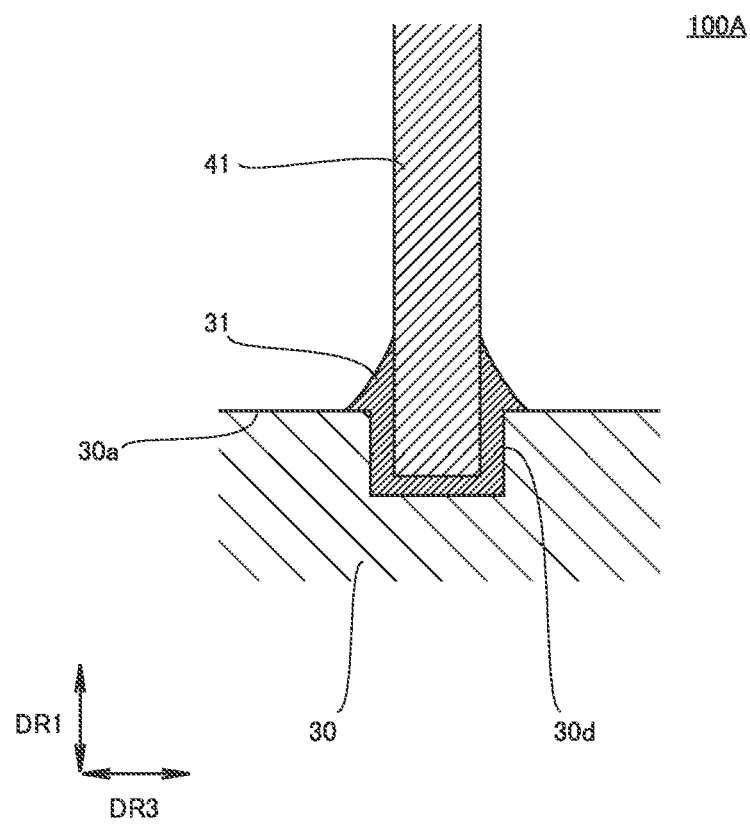
FIG. 8 is a cross-sectional view of circuit device 100A in the vicinity of a first groove 30d.
Figure 9:
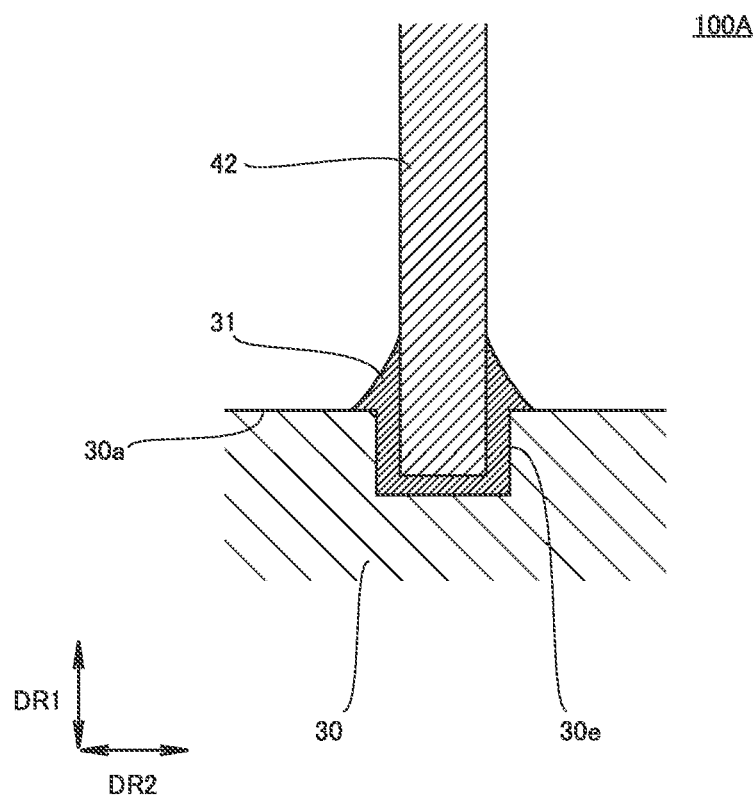
FIG. 9 is a cross-sectional view of circuit device 100A in the vicinity of a second groove 30e.

FIG. 8 is a cross-sectional view of circuit device 100A in the vicinity of first groove 30d. FIG. 9 is a cross-sectional view of circuit device 100A in the vicinity of second groove 30e. As illustrated in FIGS. 8 and 9, a first partition plate 41 and a second partition plate 42 are inserted into first groove 30d and second groove 30e, respectively. More specifically, a first end 41a side of first partition plate 41 and a third end 42a side of second partition plate 42 are inserted into first groove 30d and second groove 30e, respectively.

First partition plate 41 and second partition plate 42 are brazed to first groove 30d and second groove 30e, respectively, with a brazing material 31. That is, first partition plate 41 and second partition plate 42 are metal-joined to first groove 30d and second groove 30e, respectively. Note that first partition plate 41 and second partition plate 42 may be joined (metal-joined) to first groove 30d and second groove 30e by welding, respectively. However, first partition plate 41 does not need to be brazed (welded) at the entire portion inserted into first groove 30d. In addition, second partition plate 42 does not need to be brazed (welded) at the entire portion disposed in second groove 30e.

(Effects of Circuit Device 100A)

In circuit device 100A, first partition plate 41 and second partition plate 42 are metal-joined to first heat sink 30. Therefore, contact thermal resistance between first heat sink 30 and first partition plate 41 and second partition plate 42 is reduced, so that heat dissipation performance of a first circuit component 10 is further improved. Further, in circuit device 100A, first partition plate 41 and second partition plate 42 are inserted into first groove 30d and second groove 30e, respectively. Therefore, assemblability of first partition plate 41 and second partition plate 42 is improved, and positioning accuracy of first partition plate 41 and second partition plate 42 is improved. Since the positioning accuracy is improved, distances between first circuit component 10 (capacitor 10a) and first partition plate 41 and second partition plate 42 can be accurately set. As a result, a thickness of sealing material 50 can be reduced, and thermal resistance can be reduced. Furthermore, by fixing first partition plate 41 and second partition plate 42 to first heat sink 30, sealing material 50 can be more reliably made to fill the space defined by first partition plate 41, second partition plate 42, and first heat sink 30.

(Modification 1)

First groove 30d may be formed so as to reach both ends of upper surface 30a in second direction DR2. In this case, when first heat sink 30 is formed by extrusion processing, first groove 30d can be formed simultaneously.

(Modification 2)

First groove 30d (second groove 30e) may be widened at a portion crossing second groove 30e (first groove 30d). Further, first groove 30d (second groove 30e) may be widened at an end portion in second direction DR2 (third direction DR3). In these cases, a state is suppressed in which the widened portion described above becomes a brazing material pool, brazing material 31 overflows from first groove 30d (second groove 30e), and a manufacturing defect occurs.

Third Embodiment

A circuit device (hereinafter referred to as "circuit device 100B") according to a third embodiment will be described. Here, differences from circuit device 100A will be mainly described, and redundant descriptions will not be repeated.

(Configuration of Circuit Device 100B)

Figure 10:
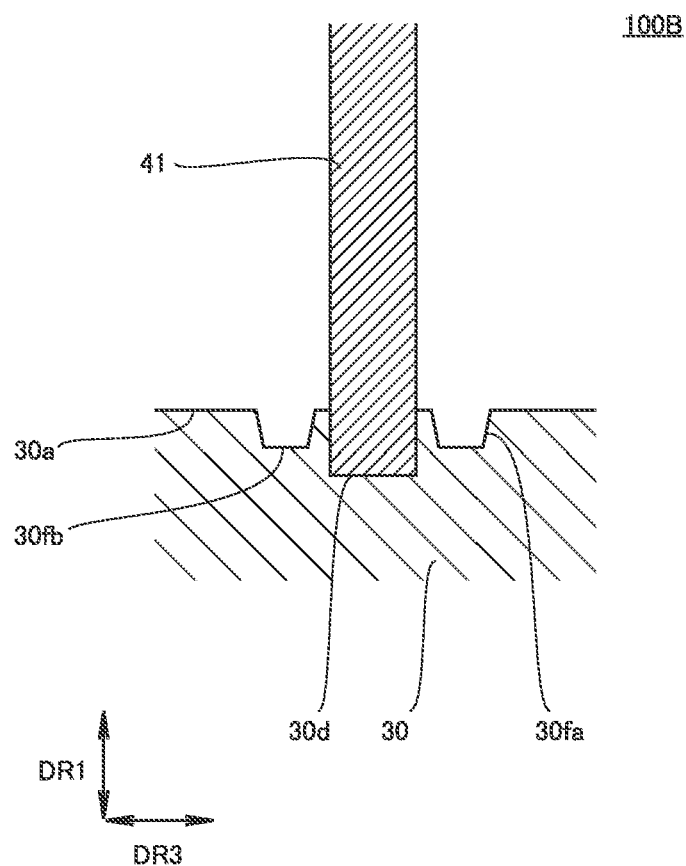
FIG. 10 is a cross-sectional view of a circuit device 100B in the vicinity of first groove 30d.
Figure 11:
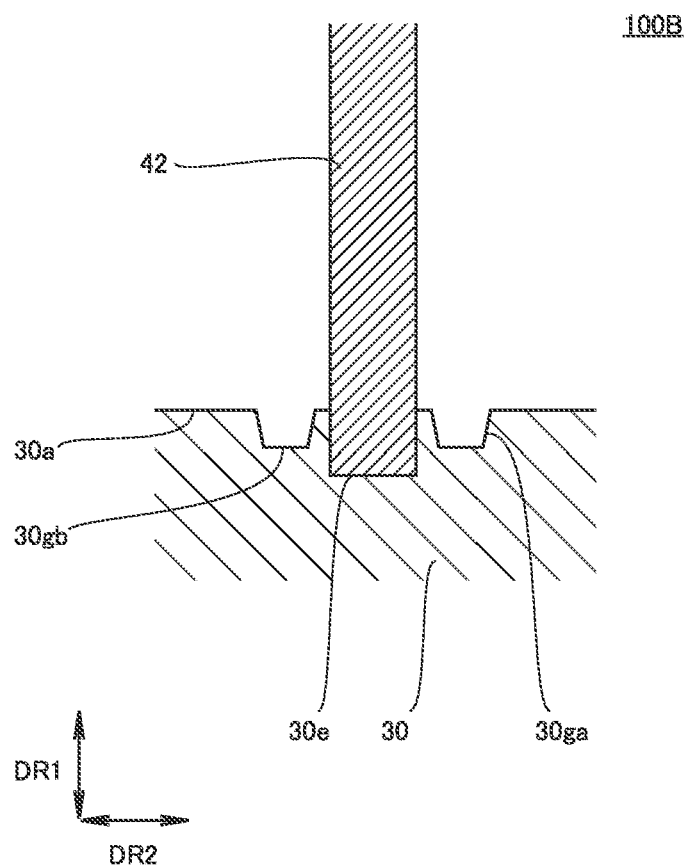
FIG. 11 is a cross-sectional view of circuit device 100B in the vicinity of second groove 30e.

FIG. 10 is a cross-sectional view of circuit device 100B in the vicinity of a first groove 30d. FIG. 11 is a cross-sectional view of circuit device 100B in the vicinity of a second groove 30e. As illustrated in FIGS. 10 and 11, an upper surface 30a is formed with a swaging groove 30fa and a swaging groove 30fb, and a swaging groove 30ga and a swaging groove 30gb.

Swaging groove 30fa and swaging groove 30fb extend in a second direction DR2. Swaging groove 30fa and swaging groove 30fb are disposed so as to sandwich first groove 30d in a third direction DR3. Swaging groove 30ga and swaging groove 30gb extend in third direction DR3. Swaging groove 30fa and swaging groove 30fb are disposed so as to sandwich second groove 30e in third direction DR3.

A first partition plate 41 is swaged to first groove 30d. More specifically, by plastically deforming a portion of a first heat sink 30 between first groove 30d and swaging groove 30fa and a portion of first heat sink 30 between first groove 30d and swaging groove 30fb toward first partition plate 41 side, first partition plate 41 is swaged to first groove 30d.

A second partition plate 42 is swaged to second groove 30e. More specifically, by plastically deforming a portion of first heat sink 30 between second groove 30e and swaging groove 30ga and a portion of first heat sink 30 between second groove 30e and swaging groove 30gb toward second partition plate 42 side, second partition plate 42 is swaged to second groove 30e.

However, first partition plate 41 does not need to be swaged at the entire portion inserted into first groove 30d. In addition, second partition plate 42 does not need to be swaged at the entire portion disposed in second groove 30e. For example, first partition plate 41 and second partition plate 42 may not be swaged at a portion where first groove 30d and second groove 30e cross each other.

When swaging is performed on first partition plate 41, a press tool is inserted into swaging groove 30fa and swaging groove 30fb. As a result, the portion of first heat sink 30 between first groove 30d and swaging groove 30fa and the portion of first heat sink 30 between first groove 30d and swaging groove 30fb are plastically deformed toward first partition plate 41 side. The swaging to second partition plate 42 is also performed by a similar method.

Note that, after only a part of first partition plate 41 (second partition plate 42) is swaged and temporarily fixed, another part of first partition plate 41 (second partition plate 42) may be swaged. This temporary fixing may be performed by spot welding.

(Effects of Circuit Device 100B)

In circuit device 100B, first partition plate 41 and second partition plate 42 are metal-joined to first heat sink 30 by swaging, and contact thermal resistance between first heat sink 30 and first partition plate 41 and second partition plate 42 is reduced, so that heat dissipation performance of a first circuit component 10 is further improved. Further, in circuit device 100B, first partition plate 41 and second partition plate 42 are inserted into first groove 30d and second groove 30e, respectively, so that assemblability of first partition plate 41 and second partition plate 42 is improved, and positioning accuracy of first partition plate 41 and second partition plate 42 is improved.

In particular, in a case where only a part of first partition plate 41 (second partition plate 42) is swaged and temporarily fixed, and then another part of first partition plate 41 (second partition plate 42) is swaged, a position of first partition plate 41 (second partition plate 42) can be finely adjusted after the temporary fixing. Therefore, the positional accuracy of first partition plate 41 (second partition plate 42) can be further improved.

Modification

In a lower surface 30b, a groove extending in second direction DR2 may be formed. A fin 30c may be configured by inserting a plate member into this groove. Note that, swaging of the plate member to the groove is performed by, for example, a method similar to the swaging to first partition plate 41 and second partition plate 42.

Fourth Embodiment

A circuit device (hereinafter referred to as "circuit device 100C") according to a fourth embodiment will be described. Here, differences from circuit device 100 will be mainly described, and redundant descriptions will not be repeated.

(Configuration of Circuit Device 100C)

Figure 12:
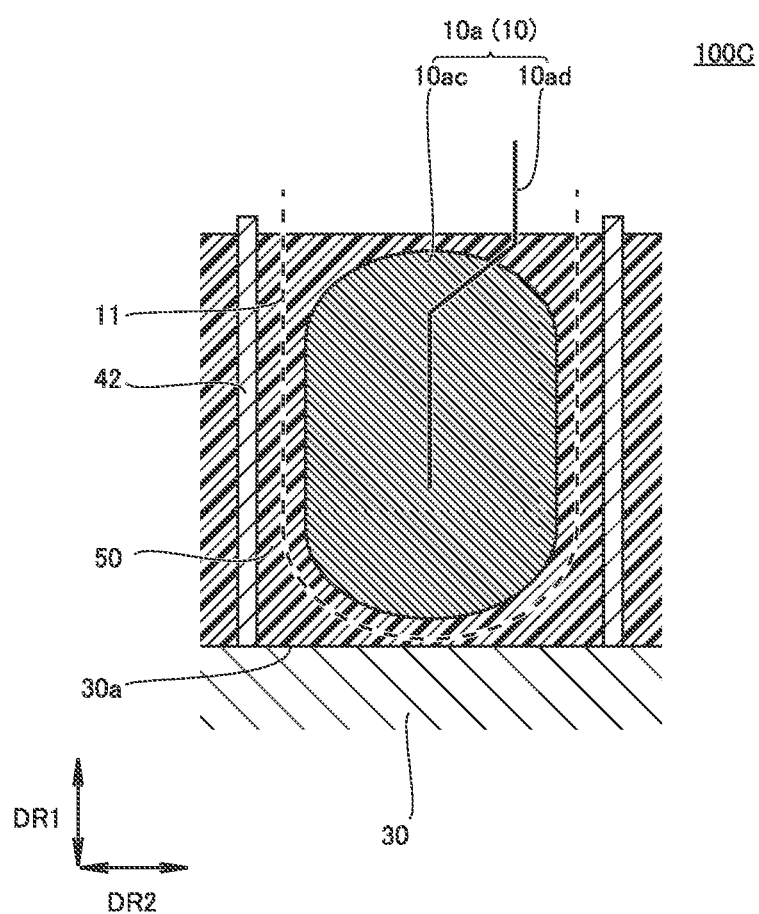
FIG. 12 is a cross-sectional view of a circuit device 100C.

FIG. 12 is a cross-sectional view of circuit device 100C. FIG. 12 illustrates a cross section of circuit device 100C at a position corresponding to FIG. 5. As illustrated in FIG. 12, in circuit device 100C, a capacitor 10a does not have an exterior case 10aa and a sealing resin 10ab. In addition, circuit device 100C further has an insulating net 11.

Insulating net 11 is formed by an insulative resin material. Insulating net 11 is disposed in a space defined by two adjacent first partition plates 41, two adjacent second partition plates 42, and an upper surface 30a so as to cover a capacitor element body 10ac. That is, insulating net 11 is located between capacitor element body 10ac and upper surface 30a, between capacitor element body 10ac and first partition plate 41, and between capacitor element body 10ac and second partition plate 42.

In circuit device 100C, a sealing material 50 may not be made by a heat dissipation auxiliary material 51 and a molding material 52. In circuit device 100C, sealing material 50 is formed by potting any resin material. This resin material is, for example, silicone. Insulating net 11 may be made by, for example, epoxy resin, silicone resin, urethane resin, PPS resin, PEEK resin, or ABS resin. Insulating net 11 may be made by a rubber material having flexibility and stretchability. In FIG. 12, capacitor 10a and insulating net 11 are not in contact with each other, but capacitor 10a and insulating net 11 may be in contact with each other. Capacitor 10a is only required not to be in contact with first partition plate 41, second partition plate 42, and upper surface 30a, by insulating net 11.

(Effect of Circuit Device 100C)

In circuit device 100C, capacitor 10a does not have exterior case 10aa. Therefore, a cross-sectional area of capacitor element body 10ac (the number of winding turns of a metal foil and a dielectric film in capacitor element body 10ac) can be increased. In this way, according to circuit device 100C, a capacitance for one capacitor 10a can be increased.

Note that, insulating net 11 and sealing material 50 are disposed between capacitor 10a (capacitor element body 10ac) and upper surface 30a, first partition plate 41, and second partition plate 42. Therefore, even without exterior case 10aa and sealing resin 10ab, insulation between capacitor 10a (capacitor element body 10ac) and upper surface 30a, first partition plate 41, and second partition plate 42 can be secured.

In circuit device 100C, since capacitor 10a having no exterior case 10aa can be used, cost of capacitor 10a can be reduced. In circuit device 100C, capacitor 10a (capacitor element body 10ac) can be sealed with only resin having low thermal resistance such as silicone as sealing material 50, so that heat generated by capacitor 10a can be efficiently transmitted to first heat sink 30.

Modification

In the above example, insulating net 11 is used as a member for securing insulation between capacitor 10a (capacitor element body 10ac) and upper surface 30a, first partition plate 41, and second partition plate 42, but insulating paper or a thermally conductive insulating sheet may be used instead of insulating net 11. Further, a spacer may be used instead of insulating net 11. By disposing this spacer between capacitor element body 10ac and first partition plate 41, second partition plate 42, and upper surface 30a, contact between capacitor element body 10ac and first partition plate 41, second partition plate 42, and upper surface 30a is prevented.

Fifth Embodiment

A circuit device (hereinafter referred to as "circuit device 100D") according to a fifth embodiment will be described. Here, differences from circuit device 100 will be mainly described, and redundant descriptions will not be repeated.

(Configuration of Circuit Device 100D)

Figure 13:
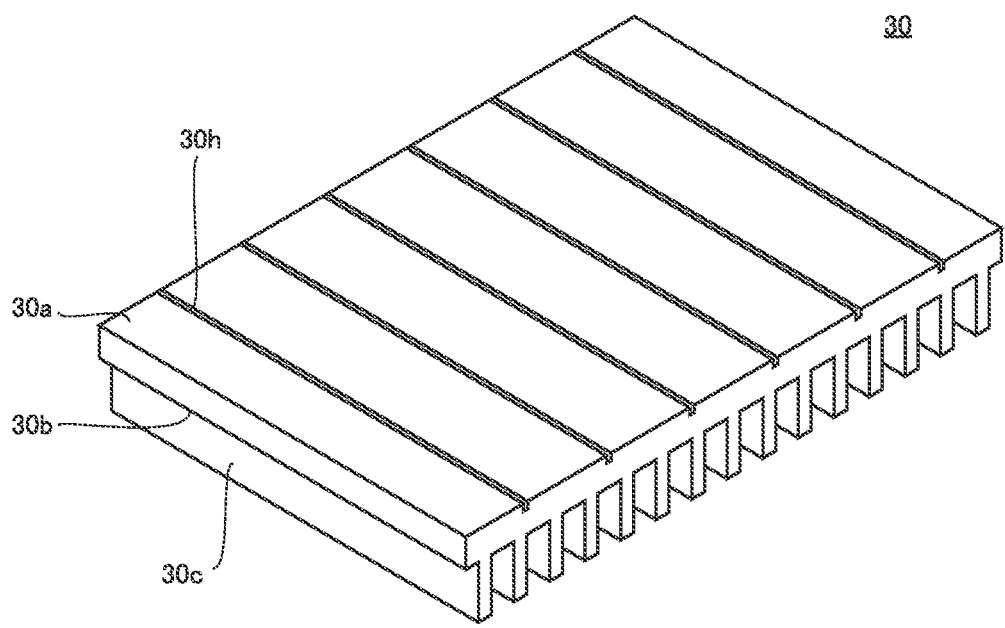
FIG. 13 is a perspective view of a first heat sink 30 included in a circuit device 100D.
Figure 13:
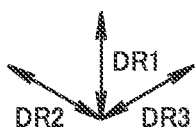

FIG. 13 is a perspective view of a first heat sink 30 included in circuit device 100D. As illustrated in FIG. 13, a groove 30h is formed in an upper surface 30a. Groove 30h extends in a second direction DR2. Groove 30h is preferably formed so as to reach both ends of upper surface 30a in second direction DR2.

Figure 14:
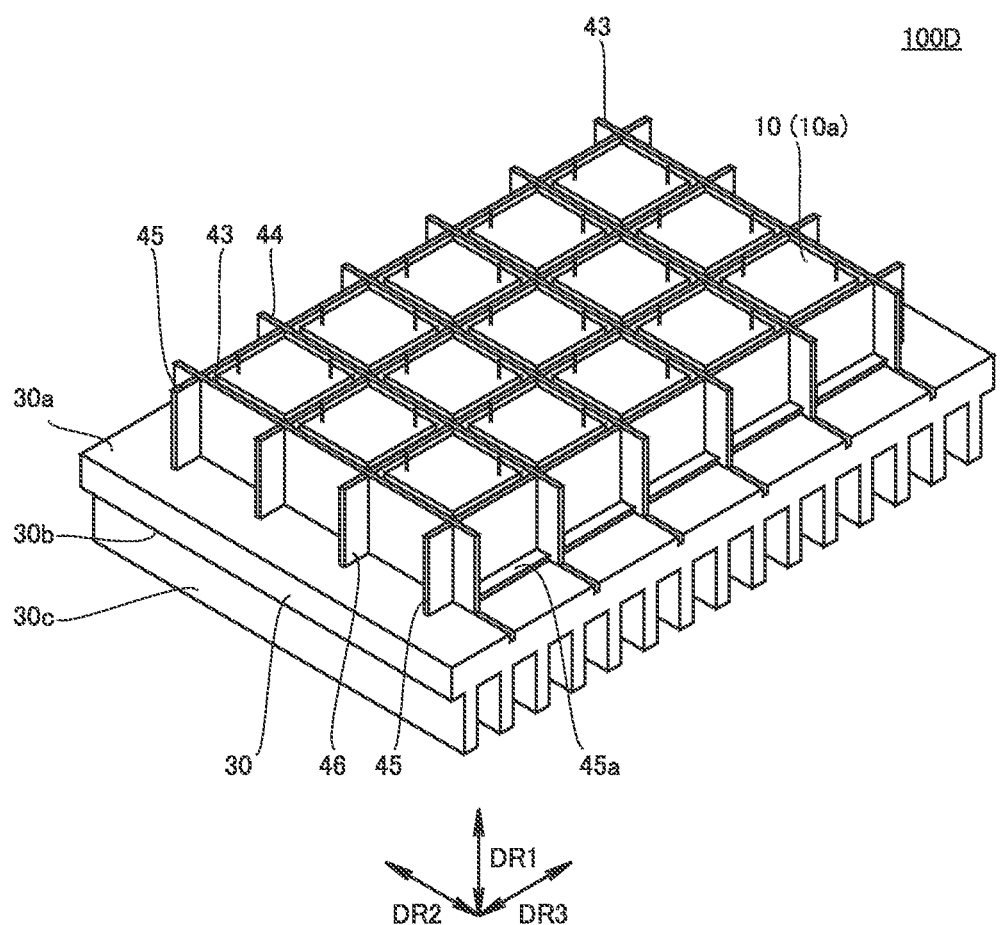
FIG. 14 is a perspective view of circuit device 100D.

FIG. 14 is a perspective view of circuit device 100D. In FIG. 14, illustration of a sealing material 50 and a printed wiring board 60 is omitted. In the following description, among a plurality of first partition plates 41, those disposed at both ends in a third direction DR3 are referred to as first partition plates 43, and those disposed at positions other than both ends in third direction DR3 are referred to as first partition plates 44. Further, in the following description, among a plurality of second partition plates 42, those disposed at both ends in second direction DR2 are referred to as second partition plates 45, and those disposed at both ends in second direction DR2 are referred to as second partition plates 46.

Figure 15:
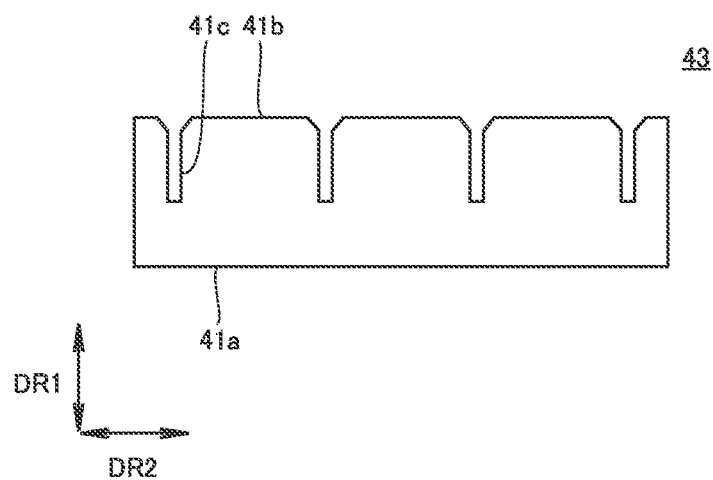
FIG. 15 is a plan view of a first partition plate 43 included in circuit device 100D.
Figure 16:
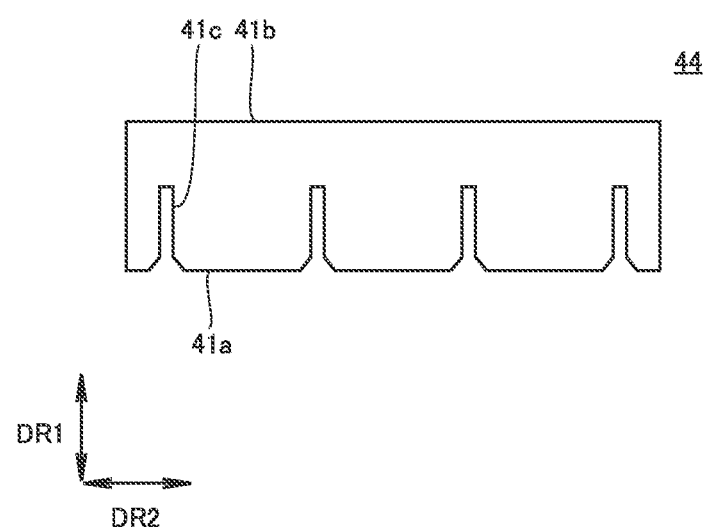
FIG. 16 is a plan view of a first partition plate 44 included in circuit device 100D.

FIG. 15 is a plan view of first partition plate 43 included in circuit device 100D. As illustrated in FIG. 15, in first partition plate 43, a first insertion port 41c extends from a second end 41b toward a first end 41a side. FIG. 16 is a plan view of first partition plate 44 included in circuit device 100D. As illustrated in FIG. 16, in first partition plate 44, first insertion port 41c extends from first end 41a toward second end 41b side.

Figure 17:
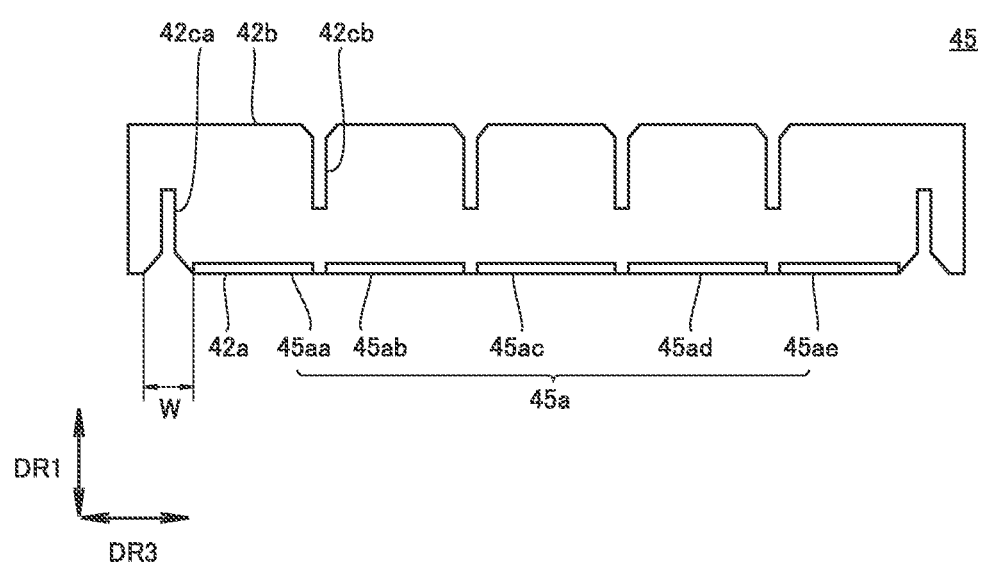
FIG. 17 is a plan view of a second partition plate 45 included in circuit device 100D.

Hereinafter, among a plurality of second insertion ports 42c formed in second partition plate 45 and second partition plate 46, those located at both ends in third direction DR3 are referred to as second insertion ports 42ca, and those located at a position other than both ends in third direction DR3 are referred to as second insertion ports 42cb. FIG. 17 is a plan view of second partition plate 45 included in circuit device 100D. As illustrated in FIG. 17, in second partition plate 45, second insertion port 42ca extends from a third end 42a toward a fourth end 42b side, and second insertion port 42cb extends from fourth end 42b toward third end 42a side.

Second partition plate 45 has a support portion 45a. Support portion 45a extends in second direction DR2 on a side opposite to second partition plate 46. Support portion 45a is formed by bending third end 42a side of second partition plate 45. Note that support portion 45a may be divided into a plurality of portions in third direction DR3 (in the example of FIG. 17, support portion 45a is divided into a first portion 45aa, a second portion 45ab, a third portion 45ac, a fourth portion 45ad, and a fifth portion 45ae).

Figure 18:
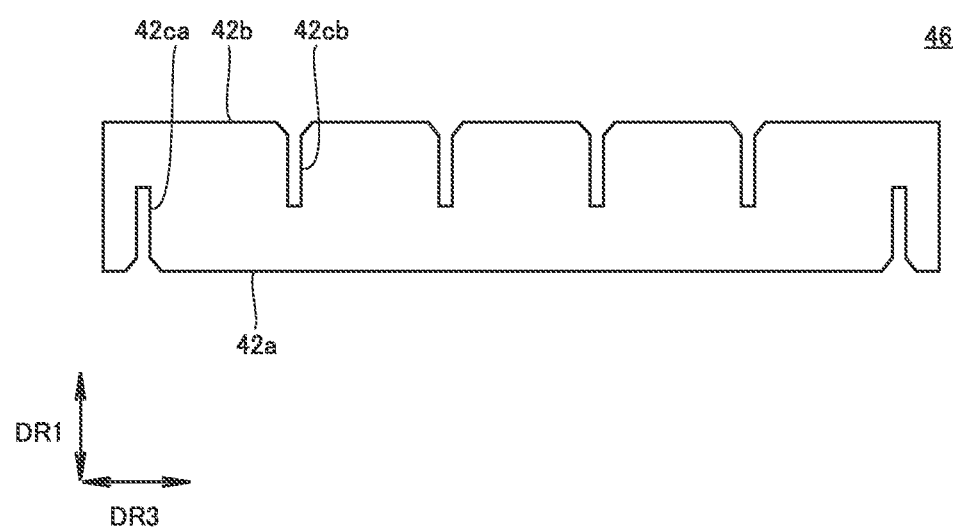
FIG. 18 is a plan view of a second partition plate 46 included in circuit device 100D.

FIG. 18 is a plan view of second partition plate 46 included in circuit device 100D. As illustrated in FIG. 18, in second partition plate 46, second insertion port 42ca extends from third end 42a toward fourth end 42b side, and second insertion port 42cb extends from fourth end 42b toward third end 42a side.

A width W at third end 42a of second insertion port 42ca of second partition plate 45 is preferably larger than a width at fourth end 42b of second insertion port 42cb of second partition plate 45. Further, width W is preferably larger than a width at second end 41b of first insertion port 41c of first partition plate 43 and a width at first end 41a of first insertion port 41c of first partition plate 44. Furthermore, width W is preferably larger than a width at third end 42a of second insertion port 42ca of second partition plate 46 and a width at fourth end 42b of second insertion port 42cb of second partition plate 46.

In circuit device 100D, first partition plate 43, first partition plate 44, second partition plate 45, and second partition plate 46 are attached to upper surface 30a by the following method. First, first partition plate 43 is inserted into grooves 30h located at both ends in third direction DR3. Secondly, by inserting second insertion port 42ca into first insertion port 41c of first partition plate 43 located at both ends in second direction DR2, second partition plate 45 is assembled to first partition plate 43. Accordingly, first partition plate 43 and second partition plate 45 are made substantially upright.

Thirdly, by inserting second insertion port 42ca into first insertion port 41c of first partition plate 43 located at a position other than both ends in second direction DR2, second partition plate 46 is assembled to first partition plate 43. At this time, since first partition plate 43 and second partition plate 45 are already substantially upright, insertion can be easily performed even if the width of first insertion port 41c and the width of second insertion port 42ca of second partition plate 46 are smaller than width W. Note that, since first partition plate 43 and second partition plate 45 are already substantially upright, second partition plate 46 is also substantially upright.

Fourthly, by inserting first insertion port 41*c* into second insertion port 42*cb* of second partition plate 45 and second partition plate 46, first partition plate 44 is assembled to second partition plate 45 and second partition plate 46. At this time, since first partition plate 43, second partition plate 45, and second partition plate 46 are already substantially upright, insertion can be easily performed even if the width of first insertion port 41*c* and the width of second insertion port 42*cb* are smaller than width W. Further, at this time, first partition plate 44 is inserted into groove 30*h* located at a position other than both ends in third direction DR3.

Fifthly, first partition plate 43, first partition plate 44, second partition plate 45, and second partition plate 46 are fixed to upper surface 30*a*. First partition plate 43 and first partition plate 44 are fixed to upper surface 30*a* by, for example, swaging to groove 30*h*. Second partition plate 45 and second partition plate 46 are fixed to upper surface 30*a* by fillet welding, for example.

(Effect of Circuit Device 100D)

In circuit device 100D, assembly accuracy of first partition plate 41 and second partition plate 42 (first partition plate 43, first partition plate 44, second partition plate 45, and second partition plate 46) is improved. Therefore, fixing of first partition plate 43, first partition plate 44, second partition plate 45, and second partition plate 46 to upper surface 30*a* (swaging of first partition plate 43 to groove 30*h* and welding of second partition plate 45 and second partition plate 46 to upper surface 30*a*) can be easily performed.

In circuit device 100D, since it is not necessary to form a groove for inserting second partition plate 45 and second partition plate 46, a step of forming the groove can be simplified. Note that, since groove 30*h* extends in second direction DR2 (the same direction as fin 30*c*), the groove can be formed at the same time when first heat sink 30 is formed by extrusion processing.

In circuit device 100D, first partition plate 43, first partition plate 44, second partition plate 45, and second partition plate 46 can be assembled with minimum holding, so that it is possible to automate the assembly step, reduce the number of man-hours in the assembly step, and simplify a jig.

Modification 1

In circuit device 100D, second partition plate 45 may be used instead of second partition plate 46. In this case, manufacturing cost can be reduced by sharing members.

Modification 2

In circuit device 100D, some of a plurality of portions included in support portion 45*a* may be bent in an opposite direction. For example, while first portion 45*aa*, third portion 45*ac*, and fifth portion 45*ae* extend in third direction DR3 on a side opposite to second partition plate 46, second portion 45*ab* and fourth portion 45*ad* may extend in third direction DR3 on second partition plate 46 side. In this case, uprightness of second partition plate 45 can be further enhanced.

Modification 3

Second partition plate 45 may be fixed to first heat sink 30 by screwing instead of welding. More specifically, second partition plate 45 may be fixed to first heat sink 30 by forming a screw hole in upper surface 30*a* and forming a penetration hole in support portion 45*a* so as to overlap with the screw hole, and screwing a screw inserted into the penetration hole into the screw hole. In this case, since second partition plate 45 can be firmly attached to upper surface 30*a*, thermal contact resistance between second partition plate 45 and upper surface 30*a* can be reduced. Note that, in a case of performing the screw fixing described above in a region where a first circuit component 10 is disposed, it is preferable to make a head of the screw not to protrude by performing countersunk head screw processing on support portion 45*a*.

Sixth Embodiment

A circuit device (hereinafter referred to as "circuit device 100E") according to a sixth embodiment will be described. Here, differences from circuit device 100 will be mainly described, and redundant descriptions will not be repeated.

(Configuration of Circuit Device 100E)

Figure 19:
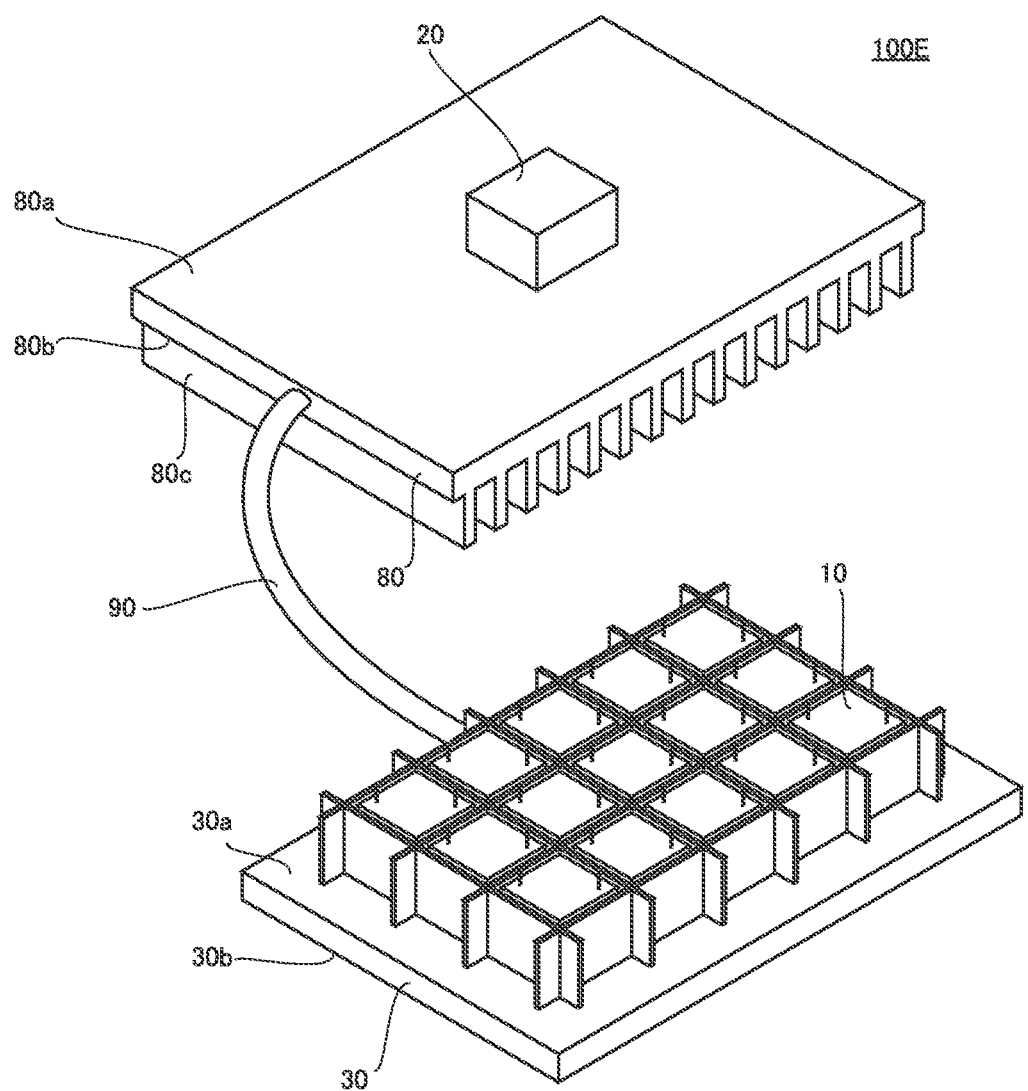
FIG. 19 is a perspective view of a circuit device 100E.

FIG. 19 is a perspective view of circuit device 100E. As illustrated in FIG. 19, circuit device 100E further has a second heat sink 80 and a heat pipe 90. Note that, in circuit device 100E, a first heat sink 30 does not have a fin 30*c*.

Second heat sink 80 has an upper surface 80*a* and a lower surface 80*b*. On upper surface 80*a*, a second circuit component 20 is disposed. Lower surface 80*b* is a surface opposite to upper surface 80*a*. A plurality of fins 80*c* are formed on lower surface 80*b*.

Heat pipe 90 thermally connects first heat sink 30 and second heat sink 80. More specifically, liquid (for example, pure water) is sealed in heat pipe 90. The pure water in heat pipe 90 is evaporated by heat from first heat sink 30. That is, the pure water in heat pipe 90 absorbs latent heat of vaporization from first heat sink 30, and cools first heat sink 30. The evaporated pure water in heat pipe 90 moves to second heat sink 80 side. A portion of heat pipe 90 between first heat sink 30 and second heat sink 80 is thermally insulated.

The pure water in heat pipe 90 having moved to second heat sink 80 side releases latent heat of vaporization to second heat sink 80 and is aggregated. The aggregated pure water in heat pipe 90 returns to first heat sink 30 side by a capillary structure (wick) provided on an inner wall of heat pipe 90. In this manner, first heat sink 30 and second heat sink 80 are thermally connected by heat pipe 90. Heat from first heat sink 30 released to second heat sink 80 is intensively dissipated by second heat sink 80.

Note that heat pipe 90 may not pass inside first heat sink 30 and second heat sink 80. Heat pipe 90 only needs to be in contact with at least first heat sink 30 and second heat sink 80.

(Effect of Circuit Device 100E)

In circuit device 100E, since first heat sink 30 can be simplified and downsized, a volume and cost of first heat sink 30 can be reduced. In addition, in circuit device 100E, an individual cooling space such as an air passage is unnecessary, and space efficiency of the entire device is improved, so that the device can be downsized.

Furthermore, in circuit device 100E, a place of first heat sink 30 can be disposed at any place. More specifically, first heat sink 30 can be disposed at an electrically optimal place, for example, in the vicinity of second circuit component 20 or in a place where a wiring length can be shortened (wiring inductance can be reduced). As a result, according to circuit device 100E, electrical performance of the entire device or a switching circuit 120 can be improved. For example, it is possible to reduce a loss caused by shortening a wiring length and to suppress a switching surge caused by reducing wiring inductance.

Seventh Embodiment

A circuit device (hereinafter referred to as "circuit device 100F") according to a seventh embodiment will be described. Here, differences from circuit device 100 will be mainly described, and redundant descriptions will not be repeated.

(Configuration of Circuit Device 100F)

Figure 20:
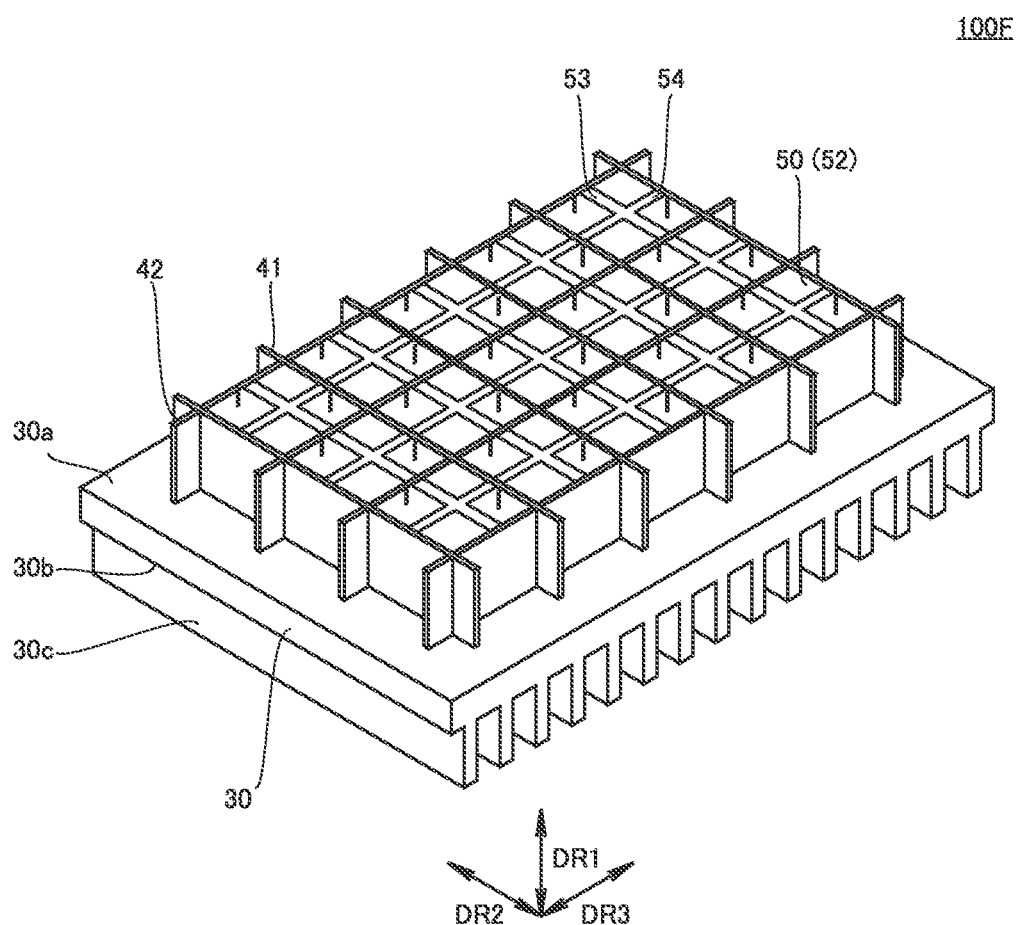
FIG. 20 is a perspective view of a circuit device 100F.
Figure 21:
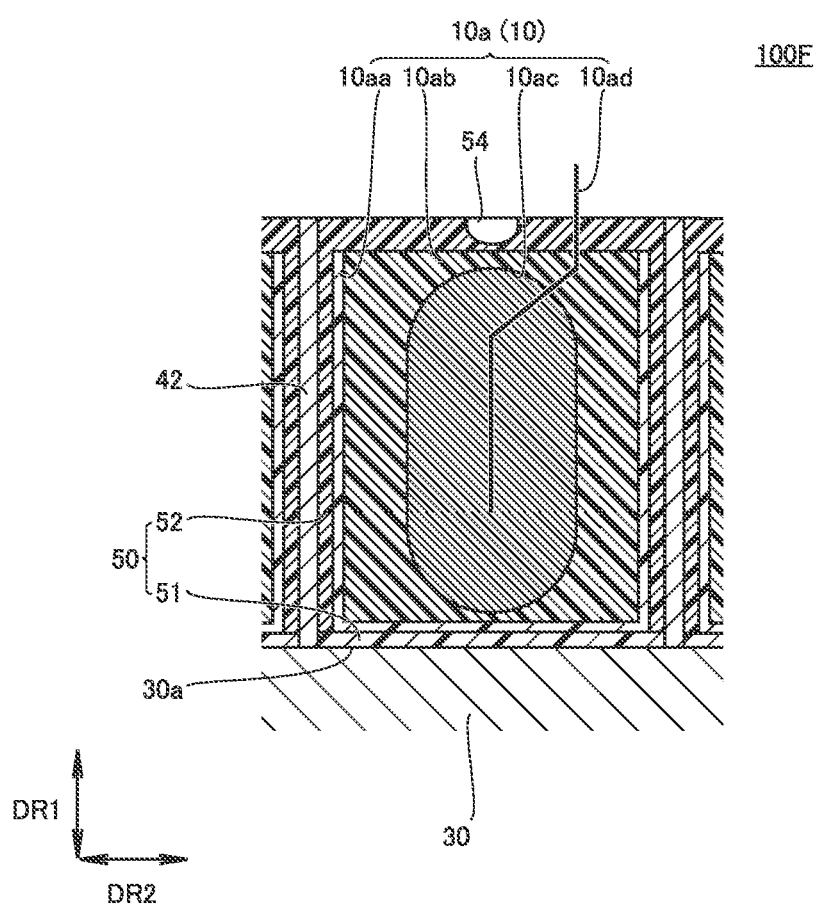
FIG. 21 is a cross-sectional view of circuit device 100F.

FIG. 20 is a perspective view of circuit device 100F. In FIG. 20, illustration of a printed wiring board 60 is omitted. FIG. 21 is a cross-sectional view of circuit device 100F. FIG. 21 illustrates a cross section of circuit device 100F at a position corresponding to FIG. 5. As illustrated in FIGS. 20 and 21, in circuit device 100F, a slit 53 and a slit 54 are formed on a surface of a sealing material 50 (molding material 52) on printed wiring board 60 side.

Slit 53 extends in a second direction DR2. Slit 54 extends in a third direction DR3. Slit 53 and slit 54 have, for example, a U-shape in a cross-sectional view orthogonal to extending directions of these. Slit 53 and slit 54 may have a V-shape in a cross-sectional view orthogonal to the extending directions of these. Either one of slit 53 and slit 54 may not be formed.

A width of slit 53 and a width of slit 54 are preferably greater than or equal to 1 mm. Formation of slit 53 and formation of slit 54 may be performed after sealing material 50 (molding material 52) is cured, or may be performed before sealing material 50 (molding material 52) is cured.

(Effect of Circuit Device 100F)

A capacitor 10a may expand when failing. In circuit device 100F, stress tends to concentrate on a portion where slit 53 is formed and a portion where slit 54 is formed, and strength is relatively low in these portions. Therefore, in circuit device 100F, even if capacitor 10a expands due to a failure, it is possible to suppress bursting of sealing material 50 (molding material 52) by breaking sealing material 50 (molding material 52) in the vicinity of slit 53 and slit 54 to alleviate a force associated with the expansion described above.

In circuit device 100F, since slit 53 and slit 54 are formed, an insulation distance between two terminals of capacitor 10a can be increased. Note that, in circuit device 100F, by forming slit 53 and slit 54 before curing of sealing material 50 (molding material 52), occurrence of a short circuit due to dust or conductive foreign matter generated at the time of slit formation processing is suppressed.

Eighth Embodiment

A circuit device (hereinafter referred to as "circuit device 100G") according to an eighth embodiment will be described. Here, differences from circuit device 100 will be mainly described, and redundant descriptions will not be repeated.

(Configuration of Circuit Device 100G)

Figure 22:
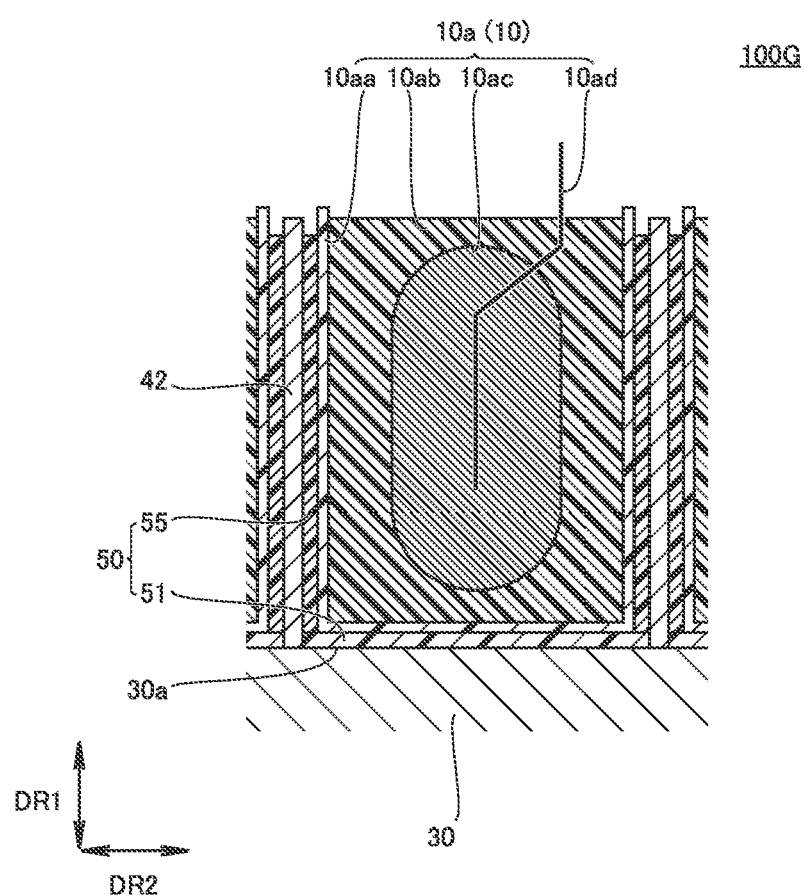
FIG. 22 is a cross-sectional view of a circuit device 100G.

FIG. 22 is a cross-sectional view of circuit device 100G. FIG. 22 illustrates a cross section of circuit device 100G at a position corresponding to FIG. 5. As illustrated in FIG. 22, in circuit device 100G, a silicone gel 55 is used instead of a molding material 52. Silicone gel 55 is made by a material having a low viscosity. Note that silicone gel 55 may be used instead of sealing material 50 (see FIG. 12) in circuit device 100C.

(Effect of Circuit Device 100G)

Silicone gel 55 has high insulation performance. In addition, since silicone gel 55 has high adhesion between with a capacitor 10a, a first partition plate 41, and a second partition plate 42, it is not necessary to consider a creeping surface at a boundary with these components/members. Therefore, an insulating area for securing a creeping surface is unnecessary, and a periphery of capacitor 10a can be downsized. In particular, when an insulating net 11 is used, a high insulation property (high creeping dielectric strength and penetrating dielectric strength) can be secured by using silicone gel 55. Further, in this case, performance of heat dissipation from capacitor 10a can be enhanced at the same time.

In addition, since silicone gel 55 is a material having a high needle penetration degree (softness), reliability when a heat cycle or a power cycle is applied is improved in circuit device 100G. Note that, since a position of capacitor 10a is fixed also by printed wiring board 60, there is no problem in fixing the position of capacitor 10a even when silicone gel 55 is used.

It is to be understood that the embodiments that have been disclosed herein are not restrictive, but are illustrative in all respects. The basic scope of the present disclosure is defined not by the embodiments described above but by the claims, and it is intended to include all modifications within the meaning and scope equivalent to the claims.

REFERENCE SIGNS LIST

10: first circuit component, 10a: capacitor, 10aa: exterior case, 10ab: sealing resin, 10ad: lead wire, 10b: inductor, 10c: contactor, 10d: discharge resistor, 10e: charge resistor, 11: insulating net, 20: second circuit component, 20a, 20b, 20c, 20d, 20e, 20f: transistor, 20g, 20h, 20i, 20j, 20k, 20l: diode, 30: first heat sink, 30a: upper surface, 30b: lower surface, 30c: fin, 30d: first groove, 30e: second groove, 30fa, 30fb, 30ga, 30gb: swaging groove, 30h: groove, 31: brazing material, 41: first partition plate, 41a: first end, 41b: second end, 41c: first insertion port, 42: second partition plate, 42a: third end, 42b: fourth end, 42c, 42ca, 42cb: second insertion port, 43, 44: first partition plate, 45: second partition plate, 45a: support portion, 45aa: first portion, 45ab: second portion, 45ad: fourth portion, 45ae: fifth portion, 46: second partition plate, 50: sealing material, 51: heat dissipation auxiliary material, 52: molding material, 53, 54: slit, 55: silicone gel, 60: printed wiring board, 70: case, 80: second heat sink, 80a: upper surface, 80b: lower surface, 80c: fin, 90: heat pipe, 100, 100A, 100B, 100C, 100D, 100E, 100F, 100G: circuit device, 110: peripheral circuit, 120: switching circuit, 130: DC supply circuit, 140: motor, 141, 142, 143: input line, DR1: first direction, DR2: second direction, DR3: third direction, W: width

The invention claimed is:
1. A circuit device comprising:
a first heat sink having a first upper surface;
a plurality of first partition plates and second partition plates provided at the first upper surface;
a sealing material;
a first circuit component; and
a printed wiring board, wherein a normal direction of the first upper surface is along a first direction, the first partition plates extend in a second direction orthogonal to the first direction, the second partition plates extend in a third direction orthogonal to the first direction and the second direction, the first circuit component is disposed in a space defined by two adjacent first partition plates among the first partition plates, two adjacent second partition plates among the second partition plates, and the first upper surface and is in contact with the first partition plate with the sealing material interposed therebetween, and the printed wiring board is disposed on the first partition plates and the second partition plates, and is electrically connected to the first circuit component.

2. The circuit device according to claim 1, wherein the sealing material includes: a heat dissipation auxiliary material applied onto the first upper surface so as to be in contact with the first circuit component; and a molding material disposed on the heat dissipation auxiliary material.

3. The circuit device according to claim 1, wherein
on the first upper surface, a plurality of first grooves extending in the second direction and a plurality of second grooves extending in the third direction are formed, and
the first partition plates and the second partition plates are inserted into the first grooves and the second grooves, respectively.

4. The circuit device according to claim 3, wherein the first partition plates and the second partition plates are joined to the first grooves and the second grooves, respectively, by welding or brazing.

5. The circuit device according to claim 3, wherein the first partition plates and the second partition plates are swaged to the first grooves and the second grooves, respectively.

6. The circuit device according to claim 1, wherein
a plurality of grooves extending in the second direction are formed in the first upper surface,
the first partition plates are inserted into the grooves,
the first partition plates each have, in the first direction, a first end that is an end on a side of the first upper surface and a second end that is an end on a side opposite to the first end,
the second partition plates each have, in the first direction, a third end that is an end on the side of the first upper surface and a fourth end that is an end on a side opposite to the third end,
in the first partition plates each, a plurality of first insertion ports disposed at intervals in the second direction are formed,
in the second partition plates each, a plurality of second insertion ports disposed at intervals in the third direction are formed,
in the first partition plates, the first insertion ports of first partition plates at both ends in the third direction extend from the second end toward the first end,
in the first partition plates, the first insertion ports of a first partition plate at a position other than both ends in the third direction extend from the first end toward the second end,
among the second insertion ports, second insertion ports at both ends in the third direction extend from the third end toward the fourth end, and are inserted into the first insertion ports of the first partition plates at both ends in the third direction,
among the second insertion ports, a second insertion port at a position other than both ends in the third direction extends from the fourth end toward the third end, and is inserted into the first insertion ports of the first partition plate at a position other than both ends in the third direction, and
among the second partition plates, each of second partition plates at both ends in the second direction has, on a side of the third end, a support portion extending in the second direction on a side opposite to, among the second partition plates, a second partition plate at a position other than both ends in the second direction.

7. The circuit device according to claim 1, wherein the first circuit component has a capacitor element body and an exterior case to house the capacitor element body.

8. The circuit device according to claim 1, further comprising an insulating net, wherein
the first circuit component is a capacitor element body, and
the insulating net is disposed so as to cover the capacitor element body.

9. The circuit device according to claim 1, further comprising:
a second heat sink having a second upper surface;
a second circuit component disposed on the second upper surface; and
a heat pipe to thermally connect the first heat sink and the second heat sink.

10. The circuit device according to claim 1, wherein
a slit is formed on a surface of the sealing material on a side of the printed wiring board, and
the slit has a U-shape or a V-shape in a cross-sectional view orthogonal to an extending direction of the slit.

11. The circuit device according to claim 1, wherein the sealing material is formed by a silicone gel.

12. The circuit device according to claim 1, wherein the circuit device is a power conversion device.

13. A circuit device comprising:
a first heat sink having a first upper surface;
a plurality of first partition plates and second partition plates provided at the first upper surface;
a sealing material;
a first circuit component; and
a printed wiring board, wherein
a normal direction of the first upper surface is along a first direction,
the first partition plates extend in a second direction orthogonal to the first direction,
the second partition plates extend in a third direction orthogonal to the first direction and the second direction,
the sealing material is made to fill a space defined by two adjacent first partition plates among the first partition plates, two adjacent second partition plates among the second partition plates, and the first upper surface,
the first circuit component is disposed in the sealing material, and
the printed wiring board is disposed on the first partition plates and the second partition plates, and is electrically connected to the first circuit component.

* * * * *